(12) United States Patent
Kok et al.

(10) Patent No.: US 8,743,542 B2
(45) Date of Patent: Jun. 3, 2014

(54) APPARATUS AND METHOD FOR COOLING OF A SUBSTANTIALLY CLOSED SPACE WITH RECIRCULATION AIR

(75) Inventors: Wouter Mathijs Kok, Amersfoort (NL); Remmert Vossepoel, Nederhorst den Berg (NL)

(73) Assignee: Deerns Raadgevende Ingenieurs B.V., Rijswijk (NL)

( * ) Notice: Subject to any disclaimer, the term of this patent is extended or adjusted under 35 U.S.C. 154(b) by 916 days.

(21) Appl. No.: 12/918,003

(22) PCT Filed: Feb. 25, 2009

(86) PCT No.: PCT/NL2009/000044
§ 371 (c)(1),
(2), (4) Date: Apr. 14, 2011

(87) PCT Pub. No.: WO2009/108043
PCT Pub. Date: Sep. 3, 2009

(65) Prior Publication Data
US 2012/0087086 A1 Apr. 12, 2012

(30) Foreign Application Priority Data
Feb. 29, 2008 (EP) ..................... 08075153

(51) Int. Cl.
*H05K 7/20* (2006.01)
(52) U.S. Cl.
USPC .......................................... 361/696; 361/701
(58) Field of Classification Search
USPC ............................................... 361/696, 701
See application file for complete search history.

(56) References Cited

U.S. PATENT DOCUMENTS

| 4,562,955 A | 1/1986 | Horster et al. |
| 4,600,050 A * | 7/1986 | Noren ................. 165/104.14 |
| 5,796,580 A * | 8/1998 | Komatsu et al. ......... 361/679.48 |
| 6,412,292 B2 * | 7/2002 | Spinazzola et al. ............. 62/89 |
| 6,434,963 B1 | 8/2002 | Urch |
| 6,819,563 B1 * | 11/2004 | Chu et al. .................... 361/696 |
| 2003/0094006 A1 | 5/2003 | Des Champs et al. |
| 2005/0237716 A1 * | 10/2005 | Chu et al. .................... 361/696 |

(Continued)

FOREIGN PATENT DOCUMENTS

| DE | 30 27 447 A1 | 2/1982 |
| DE | 33 15 444 A1 | 10/1984 |

(Continued)

OTHER PUBLICATIONS

English translation of Publication No. EP 1696 184 (A2).

(Continued)

*Primary Examiner* — Gregory Thompson
(74) *Attorney, Agent, or Firm* — Hoffmann & Baron, LLP (57) ABSTRACT

An apparatus for cooling of a substantially closed space, in particular a data center, where continuous or intermittent heat is produced by at least one heat source, with recirculation air, includes a heat exchanger with a first set of ducts and a second set of ducts, each set of ducts having an in- and outlet. The in- and outlet of the first set of ducts are connected to the space to form a first recirculation path, and the in- and outlet of the second set of ducts are connected to an environment of the space to form a second recirculation path. The heat exchanger is a plate heat exchanger.

19 Claims, 5 Drawing Sheets

(56) References Cited

U.S. PATENT DOCUMENTS

2005/0278069 A1   12/2005  Bash et al.
2006/0232945 A1*  10/2006  Chu et al. ................ 361/724
2008/0232069 A1*  9/2008   Chu et al. ................ 361/724

FOREIGN PATENT DOCUMENTS

| | | |
|---|---|---|
| EP | 1 085 272 A2 | 3/2001 |
| EP | 1 696 184 A2 | 8/2006 |
| EP | 1 901 599 A1 | 3/2008 |
| EP | 1 906 720 A1 | 4/2008 |
| JP | 2001 156478 A | 6/2001 |
| JP | 2007 116118 A | 5/2007 |
| WO | 2007/034705 A1 | 3/2007 |
| WO | 2007/034797 A1 | 3/2007 |

OTHER PUBLICATIONS

English translation of Publication No. DE 30 27 447 (A1).
English translation of Publication No. JP 2007-116118.
English translation of Publication No. JP 2001-156478.

* cited by examiner

APPARATUS AND METHOD FOR COOLING OF A SUBSTANTIALLY CLOSED SPACE WITH RECIRCULATION AIR

CROSS-REFERENCE TO RELATED APPLICATIONS

This application is the National Stage of International Application No. PCT/NL2009/000044, filed Feb. 25, 2009, which claims the benefit of European Application No. EP 08075153.0, filed Feb. 29, 2008, the contents of which is incorporated by reference herein.

FIELD OF THE INVENTION

The present invention relates to an apparatus and method for cooling of a substantially closed space, in particular a data centre, where continuous or intermittent heat is produced by at least one heat source, with recirculation air.

BACKGROUND OF THE INVENTION

When a substantially closed space is used for the placement of a relatively large amount of electronic devices such as computer hardware and/or equipment used for telecom applications, it is often referred to as a data centre.

Electronic devices usually comprise a heat source and are known to generate a relatively large amount of heat. If no appropriate measures are taken, the temperature in the space can rise to such a level that it may cause the devices to malfunction, to operate outside normal specifications, or reduce device lifetime. Thus measures need to be taken to keep at least the temperature in the space within a certain desired bandwidth, preferably at a constant level. Comparable requirements may apply for the air humidity.

Normally, the temperature inside the space is controlled by venting cool air into the space and extract the by the heat sources, e.g. electronic devices, heated air from the space for cooling, after which the cooled air is vented into the space again. The air inside the space is circulated in this manner along a first recirculation path.

The circulated air can be cooled by a relatively complex active cooling device like a compression based cooling device using a medium to transfer heat from one place to another. Such active cooling devices use a relatively large amount of energy. Further, these devices are generally not very efficient and possible leaks in the active cooling devices may cause environmental hazards depending on the medium that is used.

As an alternative, an air-to-air heat exchanger in the form of a thermal recovery wheel can be used, wherein heat is transferred from an air flow inside the space via the thermal recovery wheel to a second air flow outside the space. The use of the thermal recovery wheel is based on the insight that the temperature of the second air flow outside the space (an environment) is often low enough to cool the space to a desired temperature. In this manner, no active high-energy consuming cooling device is required for cooling.

The thermal recovery wheel is a slowly rotating wheel with an open structure that is placed partially in an air flow circulating in the space, and partially in an air flow circulating in the environment of the space. Heat is transferred from the air flow in the space to the thermal recovery wheel and subsequently to the air flow in the environment after rotation of the wheel.

The environment can be open air, but it can also be a space other than the space that has to be cooled. Preferably, the environment is a space that is substantially separated from the space that has to be cooled and is preferably large enough so that transferring a relatively large amount of heat to the environment will not cause the environment to change its temperature in such a way that the environment can not cool the space anymore.

However, a main disadvantage of the solution with the thermal recovery wheel is that air can leak through gaps between the thermal recovery wheel and the wall separating the two air flows and that the thermal recovery wheel by itself transports air from the environment to inside the space and vice versa. This makes the cooling process less effective.

The leakage and/or exchange of air in the heat exchanger may also have consequences for the fire safety installation. Normally a fire safety installation is used that reduces the oxygen level in the space to prevent a fire from starting or to extinguish the fire. When air leaks and/or is exchanged through the heat exchanger, this fire safety installation has to be bigger to compensate for the leakage and/or exchange of air or is not able to properly extinguish the fire.

The impact of wind on the façade where an air inlet and outlet to the environment are situated, may greatly increase the size of the mentioned negative effects. Similarly, these negative effects may increase during operation due to wear of the rotating thermal recovery wheel.

SUMMARY OF THE INVENTION

It is an object of the invention to increase the efficiency of the apparatus.

The invention therefore provides an apparatus for cooling of a substantially closed space, in particular a data centre, where continuous or intermittent heat is produced by at least one heat source, with recirculation air, comprising a heat exchanger with a first set of ducts and a second set of ducts, each set of ducts having an in- and outlet, wherein the in- and outlet of the first set of ducts are connected to the space, and the in- and outlet of the second set of ducts are connected to an environment of the space, characterized in that the heat exchanger is a plate heat exchanger.

The in- and outlets of the first set of ducts are connected to the space to form a first recirculation path along which air can flow from the space to the first set of ducts and from the first set of ducts back to the space.

The in- and outlets of the second set of ducts are connected to the environment of the space to form a second recirculation space along which air can flow from the environment to the second set of ducts and from the second set of ducts back to the environment.

The advantage of using a plate heat exchanger is that there is a physical separation in the heat exchanger between the air of the space and the air of the environment, resulting in less leakage and less exchange of air between the space and its environment. This makes the cooling process more effective. As some plate heat exchangers may still have some leakage, preferably a welded type of plate heat exchanger is used to eliminate any leakage at all.

The absence of, or small amount of leakage makes the apparatus also less susceptible to wind in the environment. An additional advantage is the fact that the plate heat exchanger lacks movable parts, making the apparatus simpler, easier to maintain, less susceptible to failures, wear resistant, and thus reduces its investment and maintenance costs. Yet another advantage may be that the fire safety installation can be designed smaller, because this installation does not have to compensate for leakage and/or exchange of air in the heat exchanger.

In an embodiment, the in- and outlet of the first and second set of ducts of the heat exchanger may be connected to the space and environment respectively by conduits. In case the outlet of the first set of ducts is connected to the space via a conduit, the conduit preferably has only rounded corners. This is advantageous from resistance point of view, especially when the air supplied to the space should be as uniform and as laminar as possible. Preferably, the rounded corners have a parabolic shape.

In an embodiment, the apparatus comprises a first flow circulation system to circulate air along the first recirculation path. The first flow circulation system may comprise passive means so that for instance use is made of convection flows to circulate the air. Air displacement devices, i.e. flow adjusting devices to adjust the flow rate in the first set of ducts, for example a pump or a ventilator are also possible. Preferably, the first flow circulation system divides at least a part of the first recirculation path into multiple parallel first recirculation sub-paths, wherein at least two first recirculation sub-paths have an air displacement device and a closing valve to close the corresponding first recirculation sub-path. This has the advantage that in case of maintenance or replacement of an air displacement device, the air displacement device in another first recirculation sub-path is still able to continue to circulate the air, thereby avoiding that the apparatus completely has to stop functioning in case of maintenance or the like. By closing the corresponding first recirculation sub-path with the closing valve it is also prevented that air will unnecessarily circulate in the first recirculation sub-paths, thereby increasing the efficiency.

In another embodiment, the apparatus comprises a second flow circulation system to circulate air along the second recirculation path. The second flow circulation system may comprise passive means such as a chimney provided in the second recirculation path downstream of the second set of ducts to draw air along the second recirculation path due to the temperature difference between the air at the outlet of the second set of ducts and the air in the environment. Air displacement devices, i.e. flow adjusting devices to adjust the flow rate in the second set of ducts, such as a pump or ventilator are also possible.

Preferably the second flow circulation system divides at least a part of the second recirculation path into multiple parallel second recirculation sub-paths, wherein at least two second recirculation sub-paths have an air displacement device and a closing valve to close the corresponding second recirculation sub-path. This has the advantage that in case of maintenance or replacement of an air displacement device, the air displacement device in another second recirculation sub-path is still able to continue to circulate the air, thereby avoiding that the apparatus completely has to stop functioning in case of maintenance or the like. By closing the corresponding second recirculation sub-path with the closing valve it is prevented that air will unnecessarily circulate in the second recirculation sub-paths, thereby increasing the efficiency.

In an embodiment, an air pressure inside the space is higher than an air pressure of the environment, i.e. there is an overpressure in the space. This is advantageous in case a fire safety installation is used that reduces the oxygen level in the space. The overpressure will then assure that if there is a leak in the space, low level oxygen air will leave the space due to the overpressure instead of high level oxygen air entering the space. The overpressure may be applied by a separate overpressure installation. It is also possible to provide a conduit to connect the second recirculation path downstream of an air displacement device with the space. The air displacement device is then able to apply the overpressure to the space and no separate installation may be required, which is more efficient. Preferably, the conduit is provided with a control valve. This allows to control the applied overpressure, but also to close the conduit in case of fire, thereby preventing that high level oxygen air from the environment can enter the space through the conduit.

Various options are possible regarding the way in which the in- and outlet of the first set of ducts of the heat exchanger are connected to the space. One variant is that the air cooled in the first set of ducts of the heat exchanger is vented through a floor of the space and that the by the heat sources heated air leaves the space through a ceiling of the space. Another variant is that the cooled air enters the space through a wall of the space and that the heated air leaves the space also through one of the walls. Yet another variant is that the cooled air enters the space through one of the walls, and the heated air leaves the space through a ceiling of the space. Preferably, the in- and outlet of the first set of ducts are connected such that they make use of the property that a heated medium rises.

In an embodiment, the space is divided into a cold section and a warm section by substantially air tight dividing means, the cold section being connected to the outlet of the first set of ducts, and the warm section being connected to the inlet of the first set of ducts. Cool air is then vented into the cold section. The dividing means are preferably provided with openings connecting the cold section and the warm section at a location of the at least one heat source. The cool air will thus flow to the warm section through the openings and is heated by the at least one heat source upon passing through the openings.

The dividing means can be formed by a wall and/or ceiling, but it is also conceivable that the dividing means comprise cabinets or housings of the electronic devices. The openings may then be natural/normal openings in the electronic devices and/or the cabinets/housings.

In an embodiment, the apparatus comprises a control device connected to a flow adjusting device, to control the flow rate in at least one set of ducts of the plate heat exchanger based on the required cooling capacity and/or based on the temperature of the air of the environment, in particular at the inlet of the second set of ducts of the plate heat exchanger.

In another embodiment, the apparatus comprises a control device configured to control an air flow in the first recirculation path based on a pressure difference between the cold section and the warm section. This has an advantage over an apparatus that does not control the air flow, i.e. which supplies a constant air flow, because the control is now based on a condition inside the space. It is found that by using a control based on the pressure difference, the average amount of air supplied to the space can be decreased with respect to an apparatus which supplies a constant air flow. In case air displacement devices are used to circulate the air, the energy consumption of these devices can be reduced, thereby increasing the overall efficiency of the apparatus.

Another advantage may be that the apparatus automatically adapts itself to changes in leakage of the space or the amount of openings in the dividing means. If, for example, a user of the data centre adds electronic devices to the space, thereby increasing the number of openings, he does not have to change the control of the air flow through the first set of ducts, because the control device will adjust the air flow in order to maintain a certain pressure difference.

Yet another advantage may be that if local control of a temperature of the at least one heat source is applied by adjusting the resistance through the corresponding opening in the dividing means and thereby adjust the air flow passing the at least one heat source, the resistance no longer has to be adjusted due to variations in the pressure difference, but is only adjusted due to the temperature of the at least one heat source. This makes the local control of the temperature of the at least one heat source simpler and more efficient.

The control device can control the air flow in the first recirculation path by adjusting the first flow circulation system, for instance by adjusting a size of an opening in a valve, thereby adjusting a flow resistance in the first recirculation path, or adjusting air displacement devices.

In an embodiment, the apparatus comprises a control device configured to control an air flow in the second recirculation path based on a temperature in the space. This allows the apparatus to adapt itself to the required cooling capacity and changing conditions of the environment, such as the temperature which may vary during the day, but also from day to day. The control may be based on the temperature in the cold section of the space, or the temperature at the outlet of the first set of ducts.

The control device can control the air flow in the second recirculation path by adjusting the second flow circulation system, for instance by adjusting a size of an opening in a valve, thereby adjusting a flow resistance in the second recirculation path, or adjusting air displacement devices.

The control device configured to control the air flow in the first recirculation path and the control device configured to control the air flow in the second recirculation path may be combined into one integrated control system.

In another embodiment, the apparatus comprises closing means to close at least one duct of the first set of ducts and at least one corresponding duct of the second set of ducts. This allows to use only a part of the plate heat exchanger, thereby optimizing the efficiency of the plate heat exchanger. The efficiency of a plate heat exchanger is determined, amongst others, by the velocity of the air flow through the first and second set of ducts. If due to changing conditions of the space and/or environment, the air flow in the first and/or second recirculation path changes, the velocity of the air through the first and/or second set of ducts of the plate heat exchanger also changes. By adjusting the closing means such that more or less ducts of the first set of ducts and corresponding ducts of the second set of ducts are closed, the velocity of the air through the first and second set of ducts can be adjusted, so that the efficiency of the plate heat exchanger can be optimized given the air flows in the first and second recirculation paths. Preferably, the apparatus comprises a control device configured to control the closing means based on an air flow through the first set of ducts and/or the second set of ducts.

In yet another embodiment, the apparatus comprises a perforated or porous plate before the inlet of the first set of ducts of the plate heat exchanger, said plate being arranged to provide a uniform flow to the inlet of the first set of ducts. The uniform flow to the inlet of the first set of ducts increases the efficiency of the plate heat exchanger, because the uniform flow will result in an uniform velocity in the first set of ducts, so that the efficiency of the plate heat exchanger, which amongst others depends on the velocity in the first set of ducts, is increased.

Preferably, the apparatus comprises a perforated or porous plate before the inlet of the second set of ducts of the plate heat exchanger, said plate being arranged to provide a uniform flow to the inlet of the second set of ducts. This will result in a more uniform velocity in the second set of ducts, so that the efficiency of the plate heat exchanger, which amongst others depends on the velocity in the second set of ducts, is increased.

In an embodiment of the invention, the apparatus comprises at least one extra heat exchanger. This extra heat exchanger can be of any type, but can also be another plate heat exchanger. This enables the apparatus to temporarily increase the cooling capacity when necessary. This can be advantageous for instance when the system starts up, or when a backup is needed in case of a peak demand or maintenance operations.

In an embodiment of the invention, the apparatus comprises at least one extra active cooling device, for instance in case the temperature of the environment is not low enough and extra cooling capacity is required. Extra cooling capacity can also be required during maintenance operations. The active cooling device may comprise an evaporator to extract heat from an air flow, a condenser to add heat to an air flow, and a pump being arranged to pump a medium around from the condenser to the evaporator and back in order to transport the extracted heat from the evaporator to the condenser. Preferably, the condenser is located in the second recirculation path downstream of the second set of ducts, and the evaporator is located in the first recirculation path downstream of the first set of ducts.

In an embodiment of the invention, the evaporator is arranged integral with the outlet of the first set of ducts. This has the advantage that the resistance of the evaporator can be decreased, thereby increasing the efficiency of the apparatus. Normally, the evaporator is located at a distance of the outlet of the first set of ducts. The velocity profile of the flow leaving the first set of ducts will change due to different conditions (wall roughness, cross section, etc) between the outlet of the first set of ducts and the evaporator, then the velocity profile of the flow will change due to different conditions in the evaporator. This changing of velocity profile can be expressed as flow resistance. By integrating the evaporator with the outlet of the first set of ducts, the velocity profile only changes once and not twice. Preferably, the evaporator is integrated with the outlet of the first set of ducts, such that the velocity profile will not change at all when the flow enters the evaporator. This can be done when the conditions such as wall roughness and cross section of the first set of ducts are the same as in the evaporator.

In an embodiment, the apparatus comprises a bypass around the evaporator, said bypass comprising a bypass valve to open and close the bypass. The bypass provides a low resistance flow path in case the active cooling device is not used, thereby increasing the efficiency. In case the active cooling device is used, the bypass valve is able to close the bypass, so that all air has to pass the evaporator, thereby ensuring that the active cooling device is optimally used.

In an embodiment of the invention, the apparatus further comprises means to remove water from the air cooled in the first set of ducts of the plate heat exchanger, i.e. to remove water from air inside the space after it has been cooled by the plate heat exchanger. In other words, the means to remove water are provided in the first recirculation path downstream of the first set of ducts. This enables control of the humidity level inside the space and at least keeps it below a certain maximum level.

In an embodiment of the invention, the apparatus comprises a filter to clean the air that enters the second set of ducts of the plate heat exchanger. In other words, the filter is provided in the second recirculation path upstream of the second set of ducts. In this way, it is prevented that the plate heat exchanger is polluted and reduces the maintenance costs.

In an embodiment of the invention, the apparatus comprises a mixing valve to allow heated air to flow from the outlet of the second set of ducts through the mixing valve to the inlet of the second set of ducts. In other words, the mixing valve enables air to flow from the outlet of the second set of ducts of the plate heat exchanger directly to the inlet of the second set of ducts of the plate heat exchanger. In a variant, a filter is placed between the valve and the inlet of the second set of ducts of the plate heat exchanger. The mixing valve allows heated air from the outlet of the second set of ducts to mix with cool air entering the inlet of the second set of ducts. This can be advantageous if the temperature of the air entering the inlet of the second set of ducts is below zero degrees Celsius. By mixing the cool and heated air from the second set of ducts, the temperature of the air in the second set of ducts of the heat exchanger is increased and for instance ice forming is prevented. The mixing valve can be controlled by a control device in a variant of the invention based on the temperature of the air, in particular at the inlet of the second set of ducts of the plate heat exchanger. The mixing valve has an advantage with respect to an additional heater placed in front of the inlet of the second set of ducts, because the heater would introduce extra flow resistance and the mixing valve does not.

An additional advantage may be that mixing of the air will ensure that enough air is flowing to the inlet of the second set of ducts. A plate heat exchanger has an optimal flow rate in which the efficiency of the heat exchange is optimal. If the valve is used to recirculate the air, the flow in the second set of ducts and thus through the plate heat exchanger is increased and may therefore increase the efficiency of the heat exchanger compared to an additional heater that heats the air at the inlet of the second set of ducts instead of mixing cool air with warmer air.

In an embodiment of the invention, the apparatus comprises means to directly supply the cooled air to the heat sources. This prevents the cooled air to mix with air at a higher temperature level already present in the space and thus increases the cooling efficiency.

According to an embodiment of the invention there is provided a data centre comprising a number of apparatuses according to any of the above described apparatuses. The above described apparatuses are particularly suitable for a data centre. In an embodiment, each apparatus comprises its own power supply, such as a power generator and uninterrupted power supply, thereby creating independent units also called: 'cooling cells'. The advantage is that this enables a modular setup. The cooling cells are all independent from each other and this independency creates a higher availability and reliability of the cooling capacity. In more detail, a failure of one cooling cell, or of one of its underlying facilities, will not effect the functioning of another cooling cell. The modular setup also has an advantage in terms of adaptability (in size as well as power per square meter), and in terms of investment by spreading of the investment or decreasing of the so called 'sunk costs'.

In another embodiment, the apparatus is provided in a moveable container. This allows building of the apparatus at another site and the easy transportation to a location near the space that needs to be cooled. The apparatus can then be placed inside a structure without removing the container and connections can be made to the space and environment if necessary to install the apparatus. This may also apply to the abovementioned cooling cell.

The invention also provides a method for cooling of a space, where continuous or intermittent heat is produced by at least one heat source, with recirculation air, by supplying heated recirculation air from the space to the first set of ducts of a heat exchanger and supplying air from outside the space to the second set of ducts of a heat exchanger, characterized in that the heat exchanger is a plate heat exchanger. This method prevents that air from inside the space mixes in the heat exchanger with air with unknown properties from its environment and thus increases the predictability of the conditions inside the space. This method also prevents the leakage and/or exchange of air through the heat exchanger, increasing the effectiveness of the cooling of the heat exchanger. Another advantage of the method may be that due to the reduced leakage and/or exchange of air in the heat exchanger, the fire safety installation does not have to be big to compensate for this leakage and/or exchange of air.

Preferably, the space is divided into a cold section and a warm section by substantially air tight dividing means, the cold section being connected to an outlet of the first set of ducts, the warm section being connected to an inlet of the first set of ducts, and the dividing means being provided with openings connecting the cold section and the warm section at a location of the at least one heat source, wherein an air flow through the first set of ducts is controlled based on a pressure difference between the cold section and the warm section.

This has an advantage over an apparatus that does not control the air flow, i.e. which supplies a constant air flow, because the control is now based on a condition inside the space. It is found that by using a control based on the pressure difference, the average amount of air supplied to the space can be decreased with respect to an apparatus which supplies a constant air flow. In case air displacement devices are used to circulate the air, the energy consumption of these devices can be reduced, thereby increasing the overall efficiency of the apparatus.

Another advantage may be that the apparatus automatically adapts itself to changes in leakage of the space or the amount of openings in the dividing means. If, for example, a user of the data centre adds electronic devices to the space, thereby increasing the number of openings, he does not have to change the control of the air flow through the first set of ducts, because the air flow will be adjusted in order to maintain a certain pressure difference.

Yet another advantage may be that if local control of a temperature of the at least one heat source is applied by adjusting the resistance through the corresponding opening in the dividing means and thereby adjust the air flow passing the at least one heat source, the resistance no longer has to be adjusted due to variations in the pressure difference, but is only adjusted due to the temperature of the at least one heat source. This makes the local control of the temperature of the at least one heat source simpler and more efficient.

In another embodiment, an air flow through the second set of ducts is controlled based on a temperature in the space.

Preferably, the method also includes control of the flow rate in at least one set of ducts of the plate heat exchanger based on the required cooling capacity in the space. This makes it possible to keep the temperature in the space at a more constant level. The desired constant temperature level in the cooled space is preferably above 20 degrees Celsius.

In an embodiment, the flow rate in at least one set of ducts of the plate heat exchanger is controlled based on the temperature of the environmental air, in particular at the inlet of the second set of ducts of the plate heat exchanger. This enables to anticipate changing temperature conditions of the environmental air that can change during the day, but also from day to day.

A combination of embodiments is also possible. For example, the flow rate in the first set of ducts of the plate heat exchanger can be controlled based on the required cooling capacity of the space and the flow rate of the second set of ducts of the plate heat exchanger can be controlled based on the temperature of the environmental air, in particular at the inlet of the second set of ducts of the plate heat exchanger.

BRIEF DESCRIPTION OF THE DRAWINGS

The invention will be explained according to two embodiments of the invention, shown in the drawings in a non-limiting way. In the drawings shows.

DETAILED DESCRIPTION OF THE INVENTION

Figure 1:
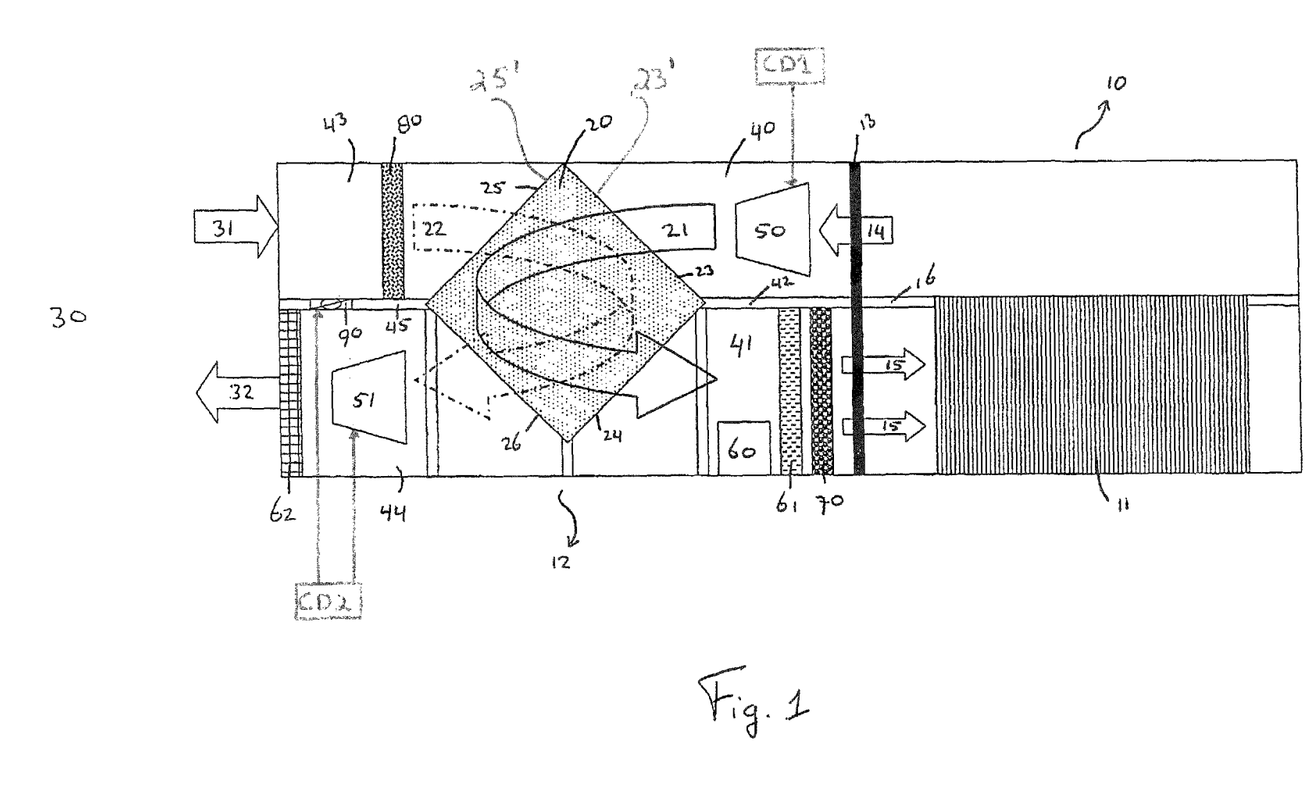
FIG. 1 a schematic side view of a space with an apparatus according to an embodiment of the invention in an adjoining space to cool the space, FIG. 2 a schematic top view of the spaces and apparatus of FIG. 1, FIG. 3 a schematic cross section of an apparatus for cooling of a space according to another embodiment of the invention, FIG. 4 a schematic top-view of an apparatus for cooling of a space according to yet another embodiment of the invention, FIG. 5 a portion of an apparatus for cooling of a space according to a further embodiment of the invention.

In FIG. 1 is shown a space 10 having heat sources 11 representing electronic devices such as computer hardware and/or equipment used for telecom applications, and a neighbouring space 12 separated from space 10 by a wall 13.

In space 12, a plate heat exchanger 20 is placed which allows two air flows, 21 and 22, through a first and second set of ducts 23', 25' (shown in further detail in FIG. 2) of plate heat exchanger 20, which are physically separated from each other. Air flow 21 flows through the first set of ducts 23' of plate heat exchanger 20, entering the first set of ducts 23' at inlet 23 and leaving the first set of ducts 23' at outlet 24. Air flow 22 flows through the second set of ducts 25' of plate heat exchanger 20, entering the second set of ducts 25' at inlet 25 and leaving the second set of ducts 25' at outlet 26. In this case, the two air flows 21 and 22 enter plate heat exchanger 20 from above, but this is not demanded. It is also possible that one air flow enters the plate heat exchanger 20 from below and a more counter-flow kind of arrangement is used.

Inlet 23 of the first set of ducts of plate heat exchanger 20 is connected to space 10 by conduit 40. Outlet 24 of plate heat exchanger 20 is connected to space 10 by conduit 41. Conduits 40 and 41 are separated by floor 42. Inlet 25 of plate heat exchanger 20 is connected to environment 30 by conduit 43. Outlet 26 is connected to environment 30 by conduit 44. Conduits 43 and 44 are separated by floor 45. The environment will preferably be outdoors.

In conduit 40 is placed a ventilator 50 as flow adjusting device to adjust the flow rate in the first set of ducts of the plate heat exchanger 20. A ventilator 51 is placed in conduit 44 to adjust the flow rate in the second set of ducts of the plate heat exchanger 20. Heated air from space 10 will flow from space 10 to conduit 40, represented by arrow 14. The natural property that a heated medium rises is used here, because the heated air of space 10 leaves space 10 through an opening in wall 13 that is placed at the top of that wall 13. Other variants are also possible. A possibility is that air leaves and enters space 10 through the ceiling and floor respectively. A floor 16 can be placed in space 10 to prevent heated air to mix with cooled air.

The air will continue to flow through the first set of ducts 23' of the plate heat exchanger 20. Heat is transferred to air in the second set of ducts of the plate heat exchanger 20 and cooled air will enter conduit 41. An active cooling device is added to the apparatus, comprising a compressor 60, first heat exchanger 61, both placed in conduit 41, second heat exchanger 62 placed in conduit 44, and an expansion valve (not shown). Not shown in this figure are the means to connect the expansion valve to first heat exchanger 61, first heat exchanger 61 to compressor 60, compressor 60 to second heat exchanger 62 and second heat exchanger 62 to the expansion valve. The air that flows from outlet 24 of the plate heat exchanger 20 to space 10 can be extra cooled by first heat exchanger 61 if the active cooling device is turned on. The heat is transferred from the air in conduit 41 to a medium present in the cooling device. The medium is then moved to second heat exchanger 62 by compressor 60 and heat is transferred from the medium to the air in conduit 44. After that the medium flows through the expansion valve back to first heat exchanger 61.

Also placed in conduit 41 are means 70 to remove water from the cooled air in conduit 41. After the water is removed by means 70, the cooled air enters space 10, indicated by arrows 15, and is supplied to heat sources 11. Again, floor 16 prevents heated air to mix with cooled air. It is also possible that the cooled air enters space 10 through the floor of space 10 and/or is directly supplied to heat sources 11.

Air from environment 30 flows to plate heat exchanger 20 through conduit 43, indicated by arrow 31. The air in conduit 43 is first filtered by a filter 80 before it enters the second set of ducts 25' of plate heat exchanger 20 through inlet 25. In plate heat exchanger 20, heat is transferred from air in the first set of ducts 23' of plate heat exchanger 20 to air in the second set of ducts 25' of plate heat exchanger 20. Air leaves the second set of ducts 25' of plate heat exchanger 20 through outlet 26 and enters conduit 44. In conduit 44 is placed second heat exchanger 62 of the extra cooling device. In this second heat exchanger 62, heat is transferred from the medium in the second heat exchanger 62 to the air flowing through conduit 44. Air leaves space 12 through conduit 44, indicated by arrow 32.

In floor 45, which separates conduits 43 and 44, a valve 90 is placed to allow air from conduit 44 to mix with air in conduit 43. In this way it is possible that air circulates in space 12 from conduit 43, through the second set of ducts 25' of plate heat exchanger 20 to conduit 44 and back again to conduit 43. This mixing of air is done for instance to increase the temperature in the second set of ducts 25' of plate heat exchanger 20 if the temperature of the air of environment 30 is below zero degrees Celsius to prevent ice-forming in the second set of ducts 25' of plate heat exchanger 20.

Figure 2:
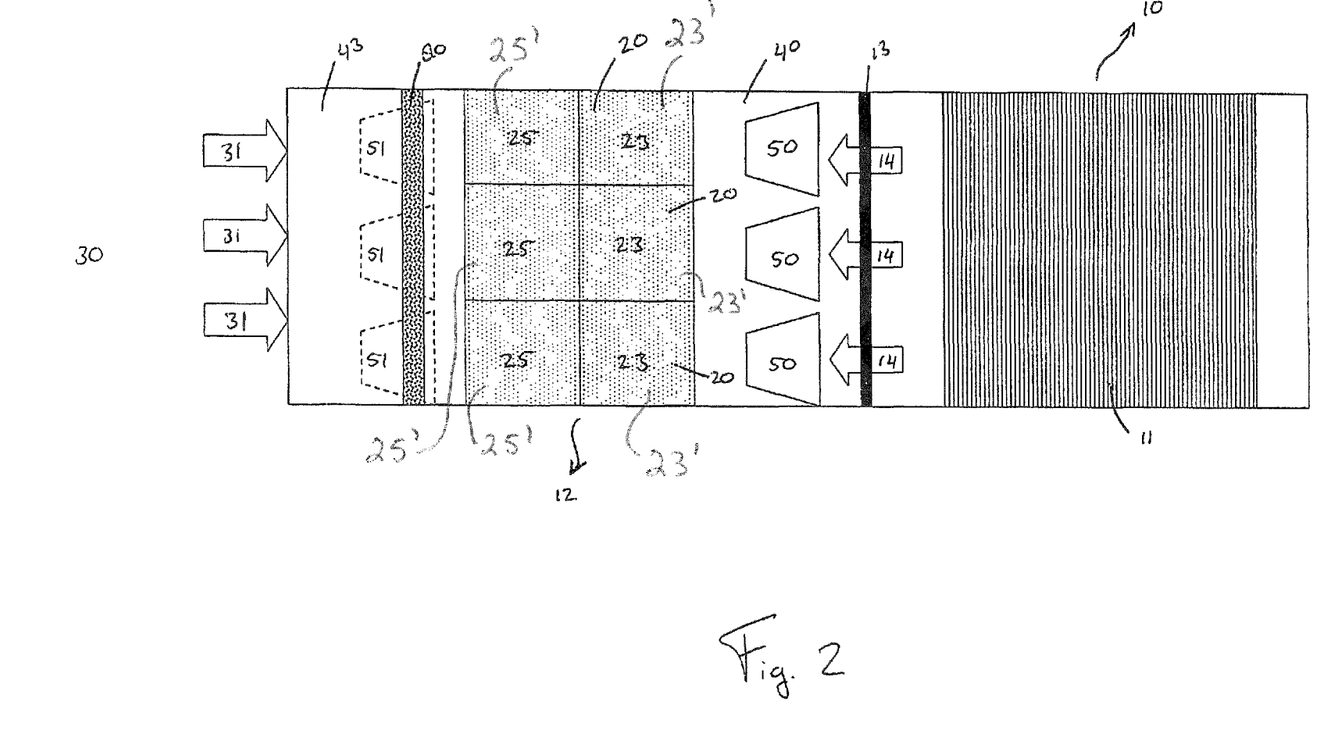

FIG. 2 shows a top view of space 10 with heat sources 11 and adjoining space 12 separated by wall 13. In space 12, other similar plate heat exchangers 20 are shown with for each plate heat exchanger 20 a ventilator 50 and 51 as flow adjusting devices. Also filter 80 is shown that cleans the air coming from environment 30. At the top of the plate heat exchangers 20, inlets 23 of the first set of ducts 23' of plate heat exchangers 20 and inlets 25 of the second set of ducts 25' of plate heat exchangers 20 are shown. This figure shows how multiple plate heat exchangers 20 can be arranged to increase the cooling capacity for space 10.

Important is that air flows 21 and 22 are separated from each other and that in space 12 in no other way, air can leak or be exchanged between conduits 40 and 41 and conduits 43 and 44. This has the advantages that the cooling is more effective, the properties like temperature, and composition of the air in space 10 are better predictable, and that in case of use of a fire safety installation (not shown) that lowers the oxygen level in space 10, the installation does not need to be bigger to compensate for the leakage and/or exchange of air.

As is shown in FIG. 1, it is also possible to add one or more control devices CD1, CD2 that measure temperatures of, for instance, air in space 10 close to heat sources 11 and the temperature of environment 30, and based on that information sends signals to ventilators 50 and 51 to control the temperature inside space 10. The control device (CD1) can be used to control valve 90 when the temperature of environment 30 drops below the zero degrees Celsius.

Plate heat exchanger 20 is placed vertically in space 12, but variations are possible: placing horizontally or under a certain angle.

The order in which certain components are placed in space 12 can also be varied. For instance in conduit 41, air flow 21 first encounters first heat exchanger 61 and than means 70. This order can also be the other way around. This is also the case with the ventilators 50 and 51. They both can be placed in front or after plate heat exchanger 20.

Figure 3:
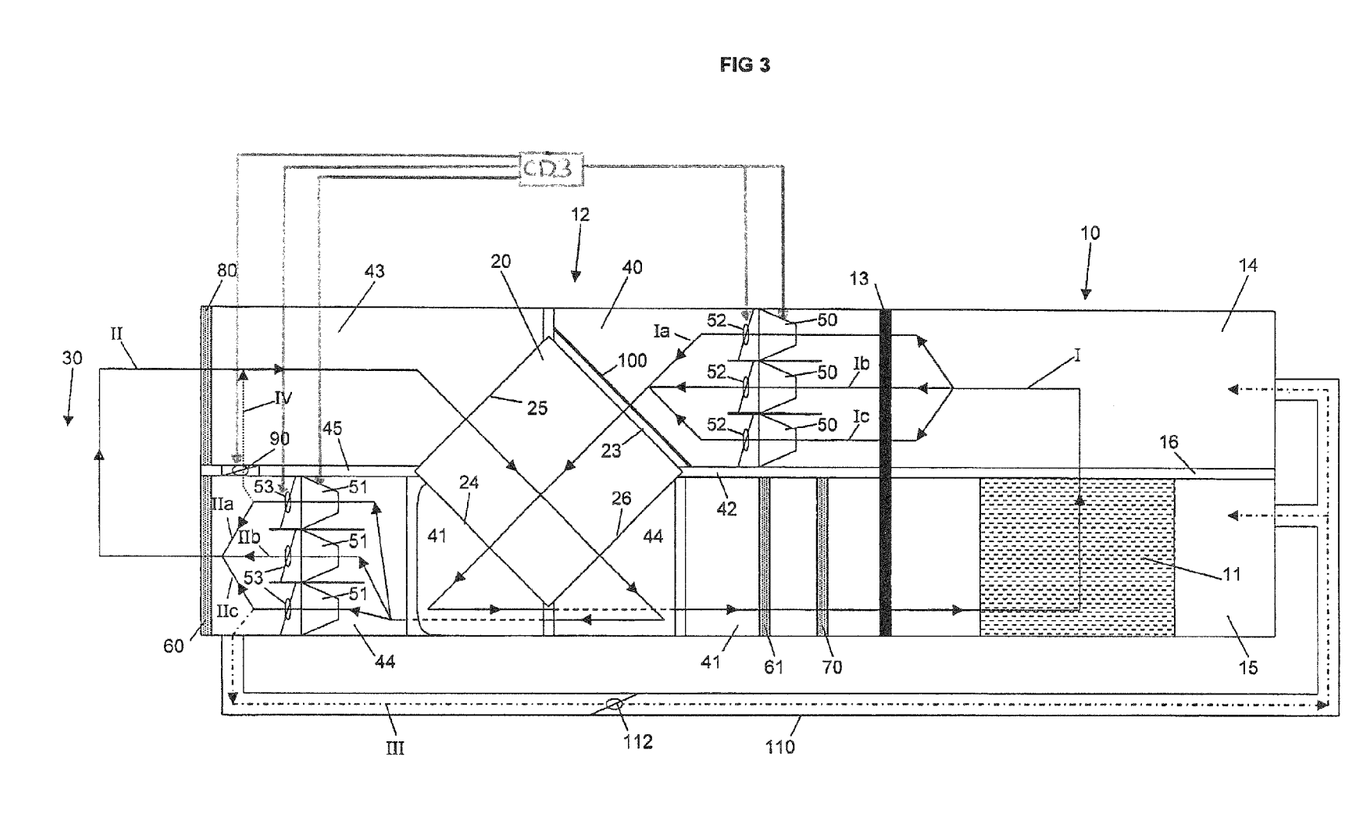

In FIG. 3 is shown a cross section of an apparatus similar to the apparatus of FIGS. 1 and 2. Like parts are indicated with like reference numbers. FIG. 3 shows an apparatus for cooling of a substantially closed space 10, which may be a data centre, where continuous or intermittent heat is produced by at least one heat source 11, with recirculation air, comprising a heat exchanger 20 with a first set of ducts and a second set of ducts, each set of ducts having an inlet 23, 25 and an outlet 24, 26, wherein the in- and outlet 23, 24 of the first set of ducts are connected to the space 10 to form a first recirculation path I, and the in- and outlet 25, 26 of the second set of ducts are connected to an environment 30 of the space 10 to form a second recirculation path II, wherein the heat exchanger 20 is a plate heat exchanger.

The space 10 is divided into a cold section 15 and a warm section 14 by substantially air tight dividing means comprising a ceiling 16. The cold section 15 is connected to the outlet 24 of the first set of ducts 23' by connecting duct 41 and the warm section 14 is connected to the inlet 23 of the first set of ducts 23' by connecting duct 40. Connecting ducts 40 and 41 are separated from each other by floor portion 42. Air is thus able to flow along first recirculation path I from space 10 to the inlet 23 of the first set of ducts 23', through the first set of ducts 23' to the outlet 24 of the first set of ducts, and back to the space 10.

The outlet 26 of the second set of ducts 25' is connected to the environment 30 by connecting duct 44 and the inlet 25 of the second set of ducts 25' is connected to the environment 30 by connecting duct 43. Connecting ducts 43 and 44 are separated by floor 45. Air is thus able to flow along the second recirculation path II from the environment 30 to the inlet 25 of the second set of ducts, through the second set of ducts 25' to the outlet 26 of the second set of ducts 25' and back to the environment 30.

The connecting ducts 40, 41, 43, 44 and the heat exchanger 20 are, in this embodiment, located in a space 12 between the space 10 and the environment 30. Space 12 and space 10 are separated from each other by wall 13 which is provided with openings to allow air to flow from space 10 to space 12 and vice versa. Space 12 can be formed by a container construction, and be placed next to space 10 without having to install parts of the apparatus individually. The container can for instance be prepared at a fabrication and/or assembly site and be transported as a module to a desired location. The container may be placed inside a structure or can be placed next to a structure, depending on the available space. Multiple containers/modules can be provided in case more cooling capacity is required, thereby resulting in a flexible system which is able to adapt itself to the desired cooling capacity without complex modifications and rebuilding.

As can be seen by the direction of the first recirculation path I and the second recirculation path II at the location of the heat exchanger 20, the first and second set of ducts are arranged such that air flows through the respective first and second set of ducts cross each other. So in order to let the air flows return to the space 10 and environment 30, the air flows have to cross each other again, as can be seen by the dashed lines in the first and second recirculation paths I, II indicating that these portions of the corresponding air flows and connecting ducts cannot be seen. Other arrangements are also possible, for instance a counter-flow or parallel flow arrangement. The construction of the connecting ducts and heat exchanger is such that the air flow along the first recirculation path I is separated from the air flow along the second recirculation path II.

The plate heat exchanger 20, preferably a welded type of plate heat exchanger to eliminate all leakage in the plate heat exchanger, transfers heat from the air flow in the first set of ducts to the air flow in the second set of ducts in case the temperature of the air flow in the first set of ducts is higher than the temperature of the air flow in the second set of ducts. This is normally the case, since the at least one heat source 11 will heat air passing the at least one heat source 11. The at least one heat source 11 can be an electronic device or can be part of an electronic device. Examples of electronic devices are computer hardware and/or equipment used for telecom applications. Preferably, the dividing means are provided with openings connecting the cold section with the warm section at a location of the at least one heat source 11. All air flowing from the cold section to the warm section will then pass the at least one heat source 11.

In connecting duct 40 a first flow circulation system is provided to circulate air along the first recirculation path I. In this embodiment, the first flow circulation system divides a part of the first recirculation path I into three parallel first recirculation sub-paths Ia, Ib, Ic. Each first recirculation sub-path is provided with an air displacement device 50, such as a ventilator, and a closing valve 52. In case one of the air displacement devices 50 is shut down for maintenance or replacement or is malfunctioning, the apparatus is still able to operate, because the other two air displacement devices are still able to circulate the air along first recirculation path I. Closing of one of the closing valves 52 prevents the formation of a counter-flow in the corresponding first recirculation sub-path in case the corresponding air displacement device 50 is malfunctioning or shut down, i.e. not operating, and another air displacement device is still operating. By preventing the counter-flow, the efficiency of the apparatus is increased.

Similar to connecting duct 40, a second flow circulation system is provided in connecting duct 44 to circulate air along the second recirculation path II. In this embodiment, the second flow circulation system divides a part of the second recirculation path II into three parallel second recirculation sub-paths IIa, IIb, IIc. Each second recirculation sub-path is provided with an air displacement device 51, such as a ventilator, and a closing valve 53. This has the same advantages as described for the first flow circulation system.

The apparatus further comprises a conduit 110 to connect the second recirculation path downstream of the an air displacement device 51 with the space 10 to apply overpressure to the space 10. In this embodiment, the conduit 110 connects second recirculation sub-path IIc with both the cold section 15 and the warm section 14 of the space 10. The air that is able to flow from connecting duct 44 to the space 10 is indicated by dashed line III. Provided in conduit 110 is a control valve to control the applied overpressure. The control valve can also be used to close the conduit 110 entirely, which is advantageous in case of fire. The control valve may be controlled by a control device (not shown).

A control device CD3 may also be provided to control the air flow in the first recirculation path I based on a pressure difference between the cold section 15 and the warm section 14. The apparatus is preferably provided with sensors to measure said pressure difference. Preferably, the control device CD3 is connected to the air displacement devices 50 and/or the closing valves 52 in order to adjust the air flow.

The control device CD3 may additionally or alternatively be configured to control the air flow in the second recirculation path II based on a temperature in the space 10. The control device CD3 is preferably connected to the air displacement devices 51 and/or the closing valves 53 in order to adjust the air flow. The temperature can be a temperature in the cold section or in the warm section, but can also be the temperature of the air at the outlet 24 of the first set of ducts. Preferably, appropriate sensors are provided.

The apparatus may also comprise closing means (not shown) to close at least one duct of the first set of ducts and at least one corresponding duct of the second set of ducts of the heat exchanger 20. Preferably, a control device is provided, which is configured to control the closing means based on an air flow through the first set of ducts and/or the second set of ducts. The aforementioned (and future) control devices may be combined into one single control system.

In front of the inlet 23 of the first set of ducts, or in other words, upstream of the inlet 23 of the first set of ducts, is provided a perforated or porous plate 100. The plate 100 is arranged to provided a uniform flow to the inlet 23 of the first set of ducts. This can be done by arranging a predetermined distribution of pores/holes density or a predetermined distribution of pore/hole size. The desired distribution may be found by analyzing or measuring the flow properties at the inlet 23 of the first set of ducts.

The apparatus further comprises an active cooling device having an evaporator 61 to extract heat from the air flow in the first recirculation path I, and a condenser 60 to add heat to the air flow in the second recirculation path II. The cooling device also comprises a pump (not shown) to pump a medium around from the condenser 60 to the evaporator 61 and back in order to transport the extracted heat from the evaporator 61 to the condenser 60. The pump can also be referred to as compressor. The condenser 60 is located in the second recirculation path II downstream of the second set of ducts, and the evaporator 61 is located in the first recirculation path I downstream of the first set of ducts. As an alternative, the evaporator could also be integral with outlet 24 of the first set of ducts to decrease the flow resistance. The active cooling device is only active in case the plate heat exchanger is not able to sufficiently cool the space 10. That is for instance in case of maintenance or when the temperature of the environment is too high. The cooling device may also comprise an expansion valve and/or compressor as is generally known to a person skilled in the art of compression based cooling devices.

Connecting duct 41 only has rounded corners in order to further reduce the flow resistance. Preferably, the rounded corners have a parabolic shape.

Floor 45 is provided with a mixing valve 90 to allow heated air to flow from the outlet 24 of the second set of ducts through the mixing valve to the inlet 25 of the second set of ducts. This air flow is indicated by arrow IV. In this embodiment, mainly air in the second recirculation sub-path IIa will flow from connecting duct 44 to connecting duct 43. A control device may CD3 be provided configured to control the mixing valve 90 based on the temperature of the environment 30. This control device CD3 may be part of an overall control system CD3.

The apparatus also comprises means 70 to remove water from the cooled air in connecting duct 41. A filter 80 is provided in connecting duct 43 to prevent dust and particles of entering the heat exchanger 20.

Figure 4:
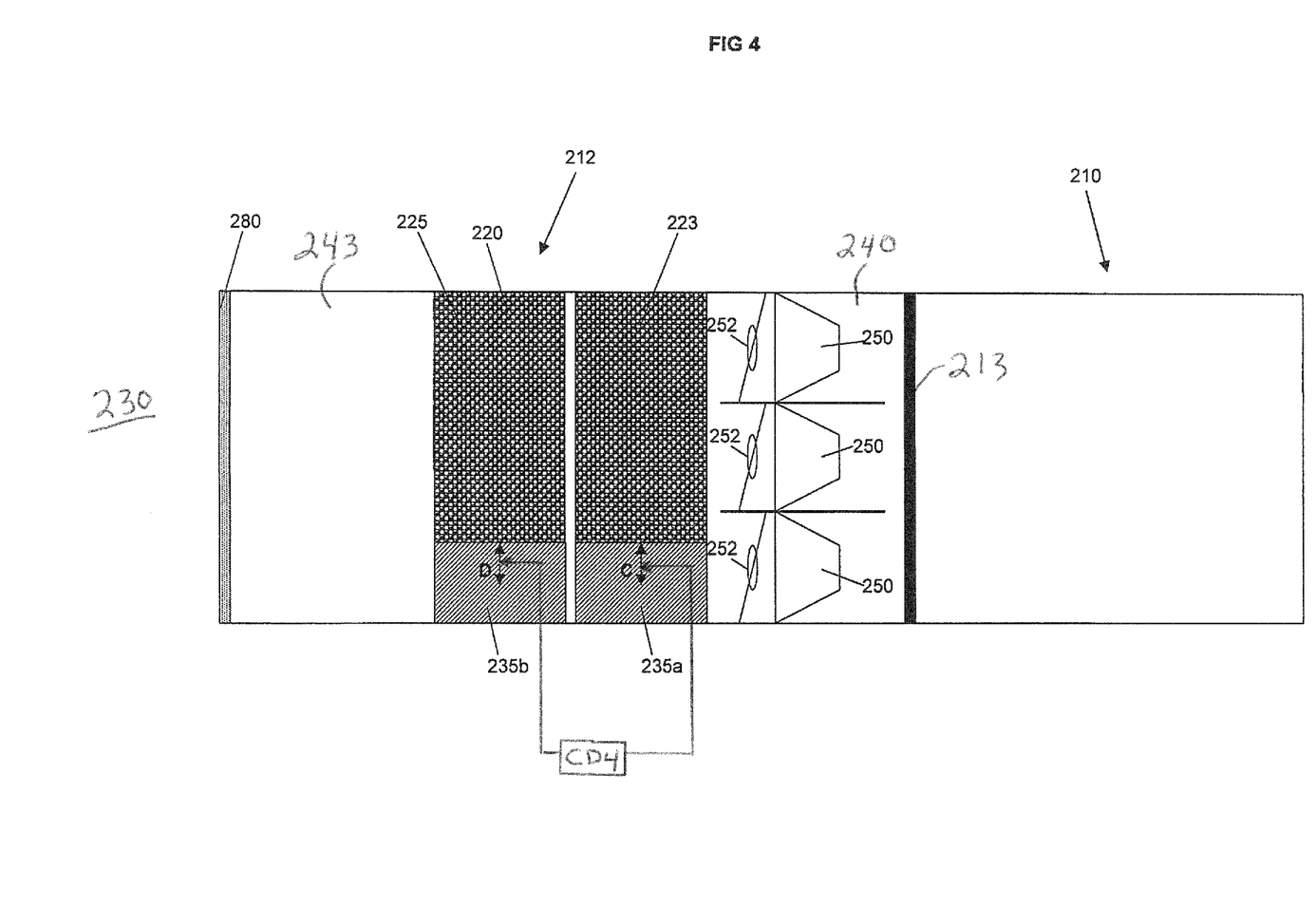

FIG. 4 shows a schematic top view of an apparatus for cooling of a space 210 according to yet another embodiment of the invention. The apparatus is similar build up as the apparatus according to FIG. 3. In space 210 continuous or intermittent heat is produced by at least one heat source (not shown). Adjacent to the space 210 is arranged a space 212, in which a plate heat exchanger 220 is provided. In between space 210 and 212 is provided a wall 213. Wall 213 has openings in order to let air flow from space 210 to space 212. The plate heat exchanger has a first set of ducts and a second set of ducts, of which only the inlets 223 and 225 respectively are shown in FIG. 4. The space 210 is cooled with recirculation air by supplying heated recirculation air from the space 210 to the first set of ducts of the heat exchanger 220 and supplying air from an environment 230 of the space 210 to the second set of ducts of the heat exchanger 220.

The inlet 223 of the first set of ducts is connected to the space 210 by connecting duct 240 and the inlet 225 of the second set of ducts is connected to the environment 230 by connecting duct 243. The air flows through the first and second set of ducts are separated from each other by the plate heat exchanger 220 and wall structures of the connecting ducts.

In connecting duct 240 is provided a first flow circulation system to circulate air through the first set of ducts. The first flow circulation system divides the connecting duct 240 into three parallel passage ways, each passage way comprising an air displacement device 250, such as a ventilator, and closing valve 252. The connecting duct 243 comprises a filter 280 before the inlet 225 of the second set of ducts.

The apparatus further comprises closing means to close at least one duct of the first set of ducts and at least one corresponding duct of the second set of ducts. In this embodiment, the closing means comprise two plate-like structures 235a and 235b which cover a part of the inlets 223 and 225 respectively, thereby closing the ducts beneath the plate-like structures. By adjusting the closing means, the amount of closing of the first set of ducts and corresponding second set of ducts can be controlled, thereby allowing to partly use the plate heat exchanger to optimize its efficiency based on the air flow through the first and/or second set of ducts. The plate-like structures 235a and 235b can be adjusted in the direction of arrows C and D respectively in order to set the amount of closed ducts of the first and second set of ducts. The closing of ducts of the first and second set of ducts can be controlled by a control device CD4 based on an air flow through the first and/or second set of ducts. Other configurations are also possible as will be apparent to a person skilled in the art.

Figure 5:
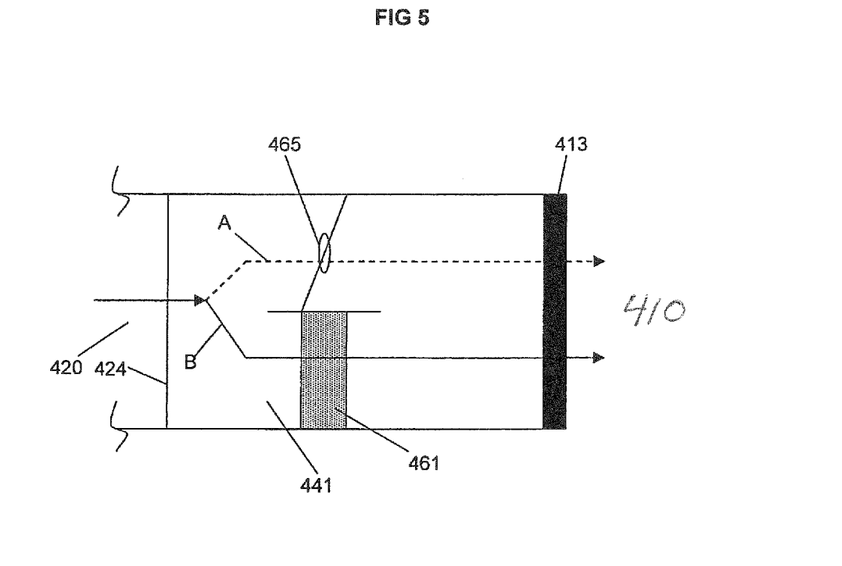

FIG. 5 shows a portion of an apparatus according to a further embodiment of the invention. Shown is a portion of a plate heat exchanger 420. An outlet 424 of a first set of ducts of the plate heat exchanger 420 is connected to a space 410 by a connecting duct 441. In the connecting duct a wall 413 is provided with openings to allow cool air to flow from the first set of ducts to the space 410. An evaporator 461, which is part of an extra active cooling device, is provided in the connecting duct 441. The evaporator 461 is able to extract heat from air flowing from the first set of ducts to the space 410 as indicated by arrow B. Normally, for efficiency reasons, the cooling device will only be operable when the cooling capacity of the plate heat exchanger is not sufficient. A bypass around the evaporator 461 is provided having a bypass valve 465. When the cooling device is not operable, and thus the evaporator 461 is not relevant for cooling, the bypass valve can be opened to allow air to flow along a flow path indicated by arrow A, thereby providing a low resistance flow path. In case the cooling device is operated and the evaporator 461 is relevant to extract heat, the bypass valve can be closed in order to close the bypass and thereby ensure that all air passes the evaporator 461, which increases the efficiency.

The invention claimed is:

1. An apparatus for cooling of a substantially closed space where continuous or intermittent heat is produced by at least one heat source, with recirculation air, comprising a heat exchanger with a first set of ducts and a second set of ducts, each set of ducts having an in- and outlet, wherein the in- and outlet of the first set of ducts are connected to the space to form a first recirculation path, the in- and outlet of the second set of ducts are connected to an environment of the space to form a second recirculation path, and wherein the heat exchanger is a plate heat exchanger, and wherein the apparatus further comprises a mixing valve to allow heated air to flow from the outlet of the second set of ducts through the mixing valve to the inlet of the second set of ducts.

2. The apparatus according to claim 1 comprising a first flow circulation system to circulate air along the first recirculation path, wherein preferably the first flow circulation system divides at least a part of the first recirculation path into multiple parallel first recirculation sub-paths, at least two first recirculation sub-paths having an air displacement device and a closing valve to close the corresponding first recirculation sub-path.

3. The apparatus according to claim 1, comprising a second flow circulation system to circulate air along the second recirculation path, wherein preferably the second flow circulation system divides at least a part of the second recirculation path into multiple parallel second recirculation sub-paths, at least two second recirculation sub-paths having an air displacement device and a closing valve to close the corresponding second recirculation sub-path.

4. The apparatus according to claim 3 comprising a conduit to connect the second recirculation path downstream of an air displacement device with the space to apply overpressure to the space.

5. The apparatus according to claim 4, wherein the conduit is provided with a control valve to control the applied overpressure.

6. The apparatus according to claim 1, wherein the apparatus comprises a control device configured to control an air flow in the first recirculation path based on a pressure difference.

7. The apparatus according to claim 1 comprising a control device configured to control an air flow in the second recirculation path based on a temperature in the space.

8. The apparatus according to claim 1 comprising closing means to close at least one duct of the first set of ducts and at least one corresponding duct of the second set of ducts.

9. The apparatus according to claim 8 comprising a control device configured to control the closing means based on an air flow through the first set of ducts and/or the second set of ducts.

10. The apparatus according to claim 1 comprising a perforated or porous plate before the inlet of the first set of ducts of the plate heat exchanger, said plate being arranged to provide a uniform flow to the inlet of the first set of ducts.

11. The apparatus according to claim 1 comprising an active cooling device having an evaporator to extract heat from an air flow, a condenser to add heat to an air flow, and a pump being arranged to pump a medium around from the condenser to the evaporator and back in order to transport the extracted heat from the evaporator to the condenser, the condenser being located in the second recirculation path downstream of the second set of ducts, and the evaporator being located in the first recirculation path downstream of the first set of ducts.

12. The apparatus according to claim 11, wherein the evaporator is arranged integral with the outlet of the first set of ducts.

13. The apparatus according to claim 11 comprising a bypass around the evaporator, said bypass comprising a bypass valve to open and close the bypass.

14. The apparatus according to claim 1, wherein the outlet of the first set of ducts is connected to the space via a conduit which has only rounded corners.

15. The apparatus according to claim 14, wherein the rounded corners have a parabolic shape.

16. A data centre comprising a number of apparatuses according to claim 1.

17. A method for cooling of a substantially closed space where continuous or intermittent heat is produced by at least one heat source, with recirculation air, by supplying heated recirculation air from the space to a first set of ducts of a heat exchanger and supplying air from an environment of the space to a second set of ducts of a heat exchanger, wherein the heat exchanger is a plate heat exchanger, and wherein heated air flows from an outlet of the second set of ducts through a mixing valve to an inlet of the second set of ducts.

18. The method according to claim 17, wherein the space is divided into a cold section and a warm section by substantially air tight dividing means, the cold section being connected to an outlet of the first set of ducts, the warm section being connected to an inlet of the first set of ducts, and the dividing means being provided with openings connecting the cold section and the warm section at a location of the at least one heat source, and wherein an air flow through the first set of ducts is controlled based on a pressure difference between the cold section and the warm section.

19. The method according to claim 17, wherein an air flow through the second set of ducts is controlled based on a temperature in the space.

* * * * *